(12) United States Patent
Mulligan et al.

(10) Patent No.: US 6,407,568 B1
(45) Date of Patent: Jun. 18, 2002

(54) APPARATUS FOR PROBING ENDS OF PINS

(75) Inventors: Vincent P. Mulligan, Port Ewen; Robert Florence, Jr.; Charles Tompkins, Jr., both of Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/501,655

(22) Filed: Feb. 10, 2000

(51) Int. Cl.$^7$ .............................................. G01R 31/02
(52) U.S. Cl. ...................................... 324/761; 324/758
(58) Field of Search ................................. 324/754, 755, 324/758, 757, 761, 765; 439/6, 217–224, 534, 912, 480–482

(56) References Cited

U.S. PATENT DOCUMENTS

| | | | | |
|---|---|---|---|---|
| 5,834,838 A | * | 11/1998 | Anderson | 257/697 |
| 5,929,521 A | | 7/1999 | Wark et al. | 257/737 |
| 6,181,149 B1 | * | 1/2001 | Godfrey et al. | 324/761 |
| 6,252,415 B1 | * | 6/2001 | Lefever et al. | 324/761 |
| 6,255,827 B1 | * | 7/2001 | Farooq et al. | 324/537 |

* cited by examiner

*Primary Examiner*—Michael J. Sherry
*Assistant Examiner*—Russell M. Kobert
(74) *Attorney, Agent, or Firm*—H. Daniel Schnurmann

(57) ABSTRACT

A probe assembly consisting of a servo mechanism or actuator providing multi-direction motion; a probe mounting attached to the actuator; and pin probes attached to the probe mounting making an electrical connection to pins of a device or package under test. The pin probe includes a shaft terminating in an end section having a conical shaped recessed area. The conical feature contained in the probe allows the probe to contact a pin or array of pins that are less then ideally located, but within their geometrical tolerance. The probe assembly thus constructed, provides reliable test measurements. It also increases test throughput by minimizing test setup time when the DUT has misaligned or bent pins. The setup can be used on a manual probe station, or in a mass production bed of nails type tester. The assembly can also be in the form of a gang probe wherein pin probes are arranged in a bed of nails arrangement to make contact with all the pins of the DUT simultaneously. The mounting is connected via a single wire, a plurality of wires, or a wiring harness to a measurement system. The pin probe is particularly well suited for probing ends of pins of multiple diameters and different pin tip geometries during various testing and/or manufacturing operations.

11 Claims, 6 Drawing Sheets

APPARATUS FOR PROBING ENDS OF PINS

FIELD OF THE INVENTION

The present invention relates generally to testing semiconductor integrated circuit packages, such as printed circuit boards, substrates, and the like during various stages of manufacturing. More particularly, it relates to a test apparatus for probing the ends of pins having multiple diameters and different pin tip configurations.

BACKGROUND OF THE INVENTION

In the microelectronic industry, integrated circuits require testing prior to being packaged to determine not only that they are fully functional but that they also conform to specifications to which they are designed. Testing is an expensive part of the fabrication process. The operability of every circuit within the integrated circuit package and of every I/O must be tested since even a single failure to conform to the design specification renders the entire integrated circuit or package unusable for its intended application.

In the semiconductor industry, chips are mounted on vehicles called substrates. They, typically, plug, into a larger printed circuit board by way of an array of pins mounted on the substrate and which number anywhere from a few to several thousand pins. When testing involves a circuit board, a card, or a substrate upon which the chips are mounted, a wire type probe tip is held against its surface until contact is made. A measurement is then taken, the result of which is used to test or characterize the device or package. These wires are an integral component of a probe which, in turn, forms part of an automated or manually operated probing machine. These machines are provided with an actuator or servo mechanism that moves an arm in the x, y and z directions, and which holds an apparatus for capturing the probing pins that make the necessary electrical measurements and check for electrical integrity. They, further, ascertain whether the device or package under test meets certain criteria in terms of functionality, quality control and performance standards.

Several types of probes are commercially available, such as, e.g., cantilever, micro-structure type, or the previously mentioned (wire type) probe tips. The tip of the latter consists of a piece of very thin wire mounted to some type holding device or fixture. This type of probing apparatus is ideal for probing flat surfaces, such as C4(controlled collapse chip connector) solder balls, electrical pads of substrates, printed circuit boards, and the like. An example of a typical sign is described in U.S. Pat. No. 5,929,521 which will be discussed in detail hereinafter.

Probes in the form of a wire generally end in a cylindrical or cone shaped termination, allowing contact with the C4 solder bumps or the surface of the device or package typical of surface mount technology, or any other type of substrate under test. By way of example, an apparatus may be required to test an electrical printed circuit board (referred to as daughter card) that plugs onto another larger printed circuit board by way of an array of pins mounted on the underside of the daughter card, and which plugs into a socket on the larger board. During manufacturing of the daughter card, electrical measurements are taken to verify the electrical integrity of the card to ensure that the final product meets the electrical specifications and the integrity of the pins making the connections necessary between the two boards. Accordingly, there is a need for a device (or vehicle) that has pins attached to it, or mounted for the purpose of providing the necessary electrical connections.

While there exists several apparatus and methods for probing a surface, the success achieved by each apparatus in making contact with the end of a pin is not always adequate. A problem exists with establishing contact with pins that are not always perfectly vertical or not perfectly centered. Thus, the end of the pin is oftentimes not positioned on the device exactly where it should, making contact with the center of the pin difficult. Accordingly, conventional setups do not always yield the desired measurement since contact is not achieved altogether or, at best, it is only partially made.

An added problem exists when pins are placed on a device having a positional tolerance. This tolerance permits a certain amount of movement of the pin end away from its theoretical ideal location on the device. Moreover, the geometry of the pin termination also varies from design to design. Some pin ends are rounded, some have a chamfer to ease the insertion of the pin into the socket in which it is to be plugged into during final assembly. This radius or chamfer on the end of the pin oftentimes causes the probe tips to slip or glide off, causing erroneous readings. The narrowing of the termination of the pin reduces the flat surface area available at the end of the pin. Thus, the probe makes no contact with the flat surface that is perpendicular to the center line of the probe tip wire. Accordingly, typical probe tips are not suited to contact a curved surface, unless the pin end resides at its theoretical ideal location to provide a tangent plane perpendicular to the center line of the probe tip. Furthermore, a coaxial condition must exist between the pin under test and the probe tip wire. Probe pins of this nature are easily bent or they become misaligned during manufacturing because the slightest contact with the pin causes the end of the pin or probe wire tip to move away from its nominal position. This bending is enhanced even further by the very small diameter or size of the probe pin wire or tip.

Referring back to the aforementioned U.S. Pat. No. 5,929,521, the probe described suffers from similar limitations which are characteristic of many conventional probe designs. In the probe apparatus described therein, the pins fail to take into account the geometric tolerance that enables moving the pin about while still remaining within specifications. It requires a multi-step etching process which is difficult to control and fabricate. Further, the design of the probe requires layers of conductive material, and the probe fails to contact the full array of C4s since it lacks the ability of accounting for grid tolerance, (in view of the grid tolerance created by the etching process). Finally, it is not cost effective.

OBJECTS OF THE INVENTION

In view of the foregoing limitations found in the art, it is an object of the invention to provide an apparatus for reliably probing ends of pins having multiple diameters and different pin tip configurations.

It is another object to provide an apparatus for probing flat surfaces such as C4 solder balls arranged in an array grid formation and attached to the chip, electrical pads of substrates, printed circuit boards, or to any other device provided with electrical contact points that are reasonably flat.

It is still another object to provide a probe tip suited to contact curved surfaces.

It is a further object to use a simple machining technique to simplify the manufacturing requirements for the probing machine, increase the ease of its use and lower its cost.

It is yet another object to provide a probe machine easily adapted to any pin configuration, to any chip and packaging design without having to redesign the probe with each new design.

SUMMARY OF THE INVENTION

The above discussed drawbacks, and deficiencies of the prior art are overcome or alleviated by utilizing the pin probe of the present invention, wherein the probe apparatus creates a self-centering contact, such that its shape captures the pin throughout its tolerance range and treats it as if it were ideally installed. Thus, the probe of the present invention has an extra degree of freedom that provides ease of movement and which can be tailored to fit any particular use and application.

The design of the probe of the present invention is straight forward. It is provided with a rigid mount that can be attached to any auto or manual servo or actuator. The probe is designed to have a built-in tolerance that allows locating pins and balls in a grid within their respective tolerances and still make good contact.

In another aspect of the invention, there is provided a conical, parabolic or hyperbolic recess giving it a rounded end and tapered sides that allows pins and C4s to move within their grid tolerance and still be contacted, allowing accurate measurements to be taken.

One variant of the probe is an apparatus that is round and mounted to a chucking device and put into contact with the device to be tested or examined.

In yet another aspect of the invention, there is provided a probe assembly that includes: means for providing multi-direction motion; and means for making electrical contact to pins of a device or package under test and for probing the pins, these means including a shaft terminating in an end section provided with a conical shaped recessed area.

In still another aspect of the invention, there is provided a gang probe assembly that includes: a servo mechanism providing multi-direction motion; and a plurality of pin probes arranged in an array formation attached to the servo mechanism and making simultaneous contact with an array of pins attached to a device or package under test, wherein each of the pin probes includes a shaft having an end section provided with a recessed conical section.

BRIEF DESCRIPTION OF THE INVENTION

These and other objects, aspects and advantages of the invention will be better understood from the following detailed description of a preferred embodiment to be described hereinafter when taken in conjunction with the appended drawings, in which:

FIG. 5 shows a gang probe utilizing the pin probe to contact multiple pins of a device such as a daughter board, substrate, and the like.

DETAILED DESCRIPTION OF THE INVENTION

Figure 1:
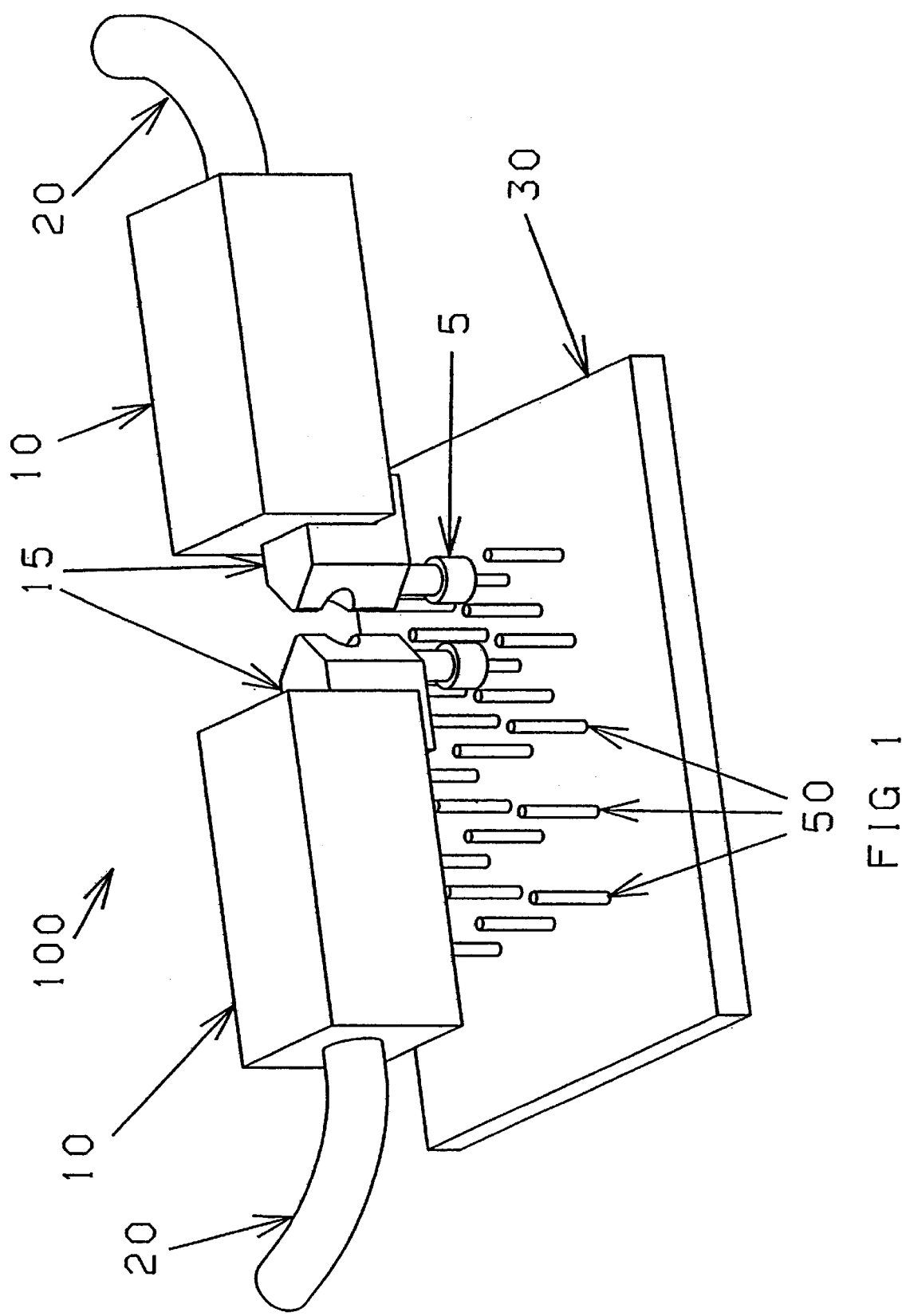
FIG. 1 is a perspective view illustrating the preferred embodiment of the probe to a device provided with pins, in accordance with the present invention.

Referring to FIG. 1, a probe assembly (100), in accordance with the present invention, is shown attached to an XYZ servo mechanism (10) contacting DUT pins (50) mounted on a substrate or printed circuit board (30). The probe pin (5) is attached to a mounting block (15) which is fastened to the servo mechanism (10). The servo mechanism is connected to the measurement system (not shown) by holding a wiring harness (20) in the form of a single wire, a coaxial cable (for noise considerations), or a plurality of wires each contacting a separate pin probe (if a gang probe type setup is used). The servo mechanism (10) connects the probe mounting block (15) to a tester (not shown) by way of the wiring harness (20). The XYZ servo mechanism (10) provides the necessary motion for the pin probe (5) to maneuver within the test area, enabling the pin probe (5) to contact the pins under test (50). The servo mechanism (10) further makes contact to the measuring apparatus (not shown) via the wiring harness (20), such as a digital multimeter for resistance measurements, a source measurement unit for sourcing current and measuring voltage and vice versa, a power supply providing power to the unit under test, and the like.

The servo (10) is shaped by a design which is dictated by the particular application. It provides an electrical connection between the wiring harness (20) and the probe mounting block (15). This probe mounting block (15) is, preferably, secured by screw(s) or by some other fastening means to maintain a solid mounting surface on the servo system (10) to which the detachable probe block (15) is affixed. The block allows the probe pin (5) to be mounted on it. It also provides an electrical connection that ensures that the probe contacts the pin under test (50) and ensures a reliable setup when measurements are taken or electrical signals or power are applied.

The design of the block (15) allows the probes to be located in close proximity to one another. Pin probe (5) is designed to account for the distance between the pins under test (50). The diagonal spacing between pins is of the order of 1.2 mm. When seen from one pin to another pin on the same row, it measures 2.4 mm. The diameter of the pin under test is 0.3 mm. The pin probe outer diameter (OD) is of the order of about 1.14 mm The conical recessed area at its widest part (located at the bottom) has an OD of approximately 0.76 mm, whereas its OD measures about 0.381 mm at its narrowest point. The depth of the conical area is typically of the order of 0.89 mm. This allows probes (5) to contact pins that are arranged in a tight array or grid formation, typical of semiconductor packages. The recessed feature of the pin probe is, preferably, conical, cylindrical or hyperbolic. This increases the pin range under which it picks a pin under test (50) while incorporating the tolerance of the grid in which the pin under test (50) is located. The conical feature gives the probe a self-centering feature that enhances the capture of the pin under test (50) and insures good electrical contact that secures accurate readings. This is a critical feature as some of the measurements taken are small, and any difference may lead to an erroneous pass or fail type result.

As previously mentioned, the probe (5) mounted on block (15) is detachable and can be changed quickly and easily to guarantee that production levels and throughput are maintained. It offers flexibility in that block (15) which mounts the probe can be modified to fit a great variety of applications and still maintain ease of use and maintenance. Not withstanding, its primary function is to maintain good electrical contact with the probe (5) and electrical connection to the wiring harness (20) on the base (10) on which it is mounted. The mounting with a screw shown herein is only for exemplary purposes, but others fastening means, e.g., clamps, and the like may be employed with equal success.

Figure 2:
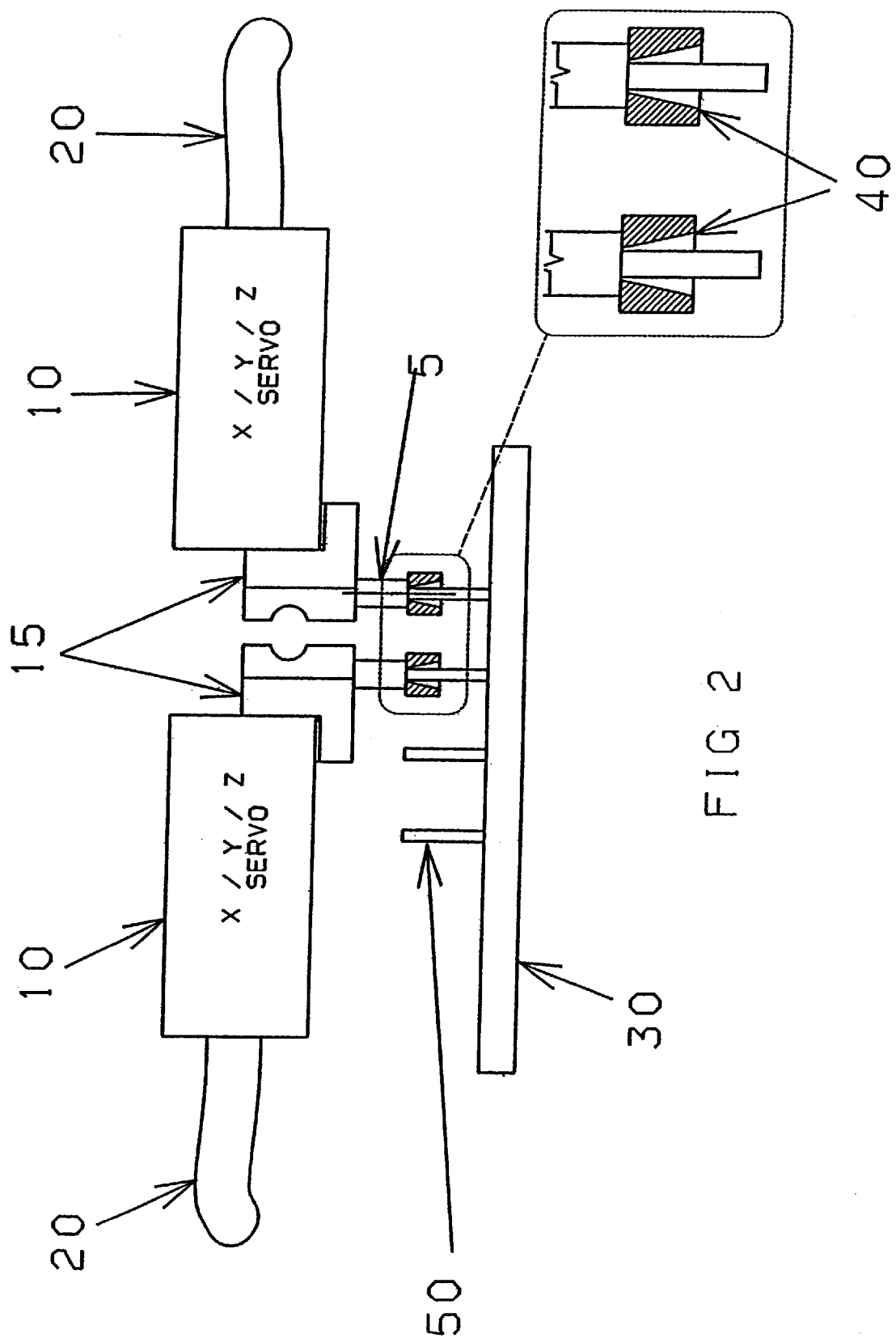
FIG. 2 is a side view schematic showing a cut away view of the probe pin in contact with the device pin. Also shown is the probe mounting block and the servos, illustrating the relative position of the probes when in contact with the device.

For sake of clarity, the probe assembly (100) is further illustrated in FIG. 2, seen from a side view perspective. Therein is shown probe (5) contacting a substrate or circuit board (30) containing an array of pins (50). The probe is attached to a block within which it is inserted and pressed in. In most cases, this block (15) is screwed to the XYZ servo mechanism (10) which maneuvers the probe assembly and makes contact with the various points intended to be tested. Furthermore, some type of electrical contact is needed to attach block (15) to a wire (20) connecting the pin probe electrically to the measurement system. Cable (20) is a schematic representation of a wire or harness that makes electrical contact of the pin probe back to the actual measurement apparatus. The probe (5) is shown cut away in order to illustrate a magnified representation of the aforementioned conical feature (40) that enables the probe to make contact with the substrate pins (50). The conical recessed area takes into account the tolerances of pins (50) located on the substrate or circuit board (30). Considerations must also be taken for the automated probing device (10, 20) as well as for issues concerning collision avoidance which vary from one probing tool design to the next. These will be addressed hereinafter in greater detail.

Figure 3:
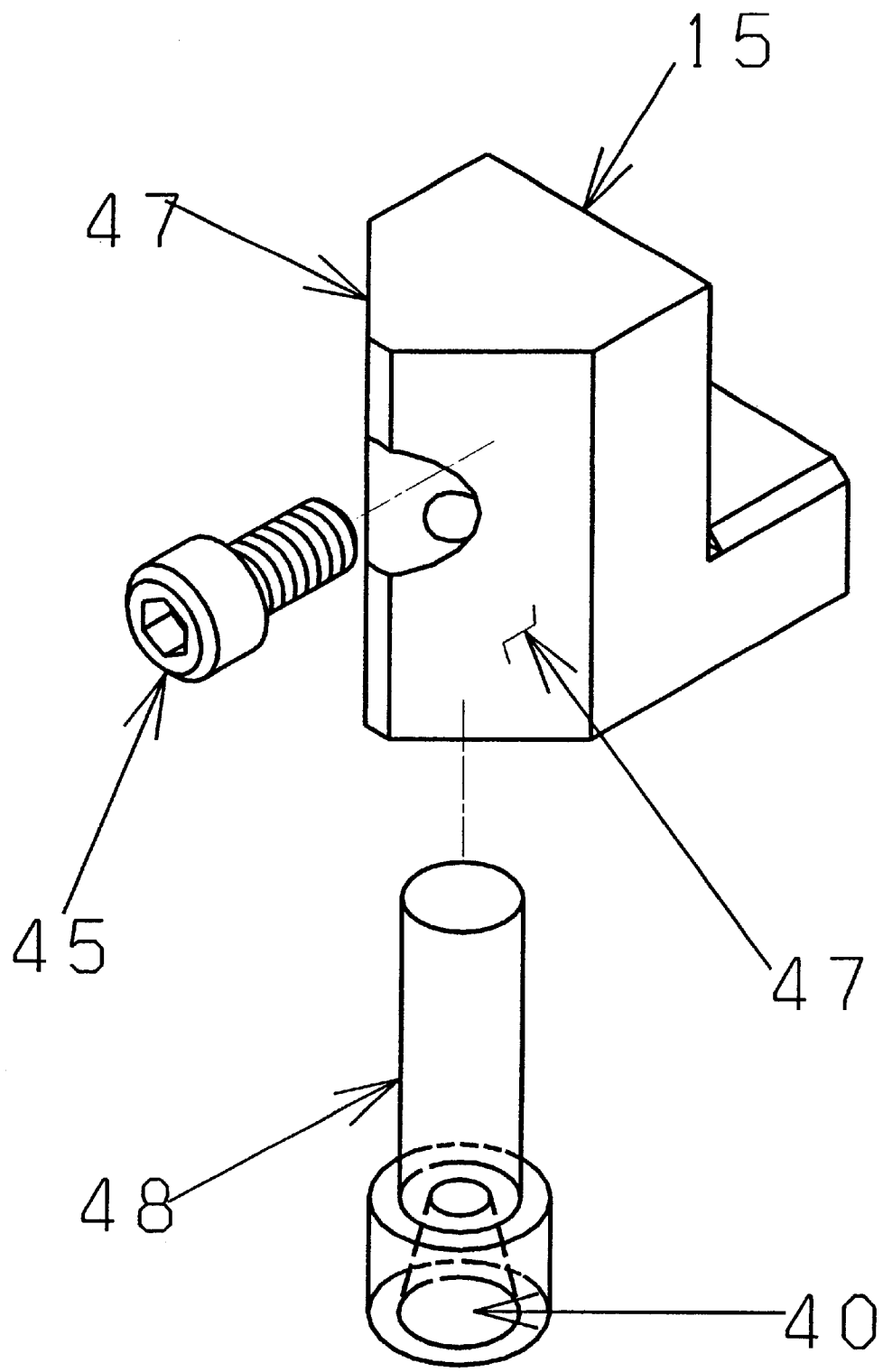
FIG. 3 is an exploded view of the probe. It also shows a probe mounting block and retaining screw for mounting the probe to the manufacturing or testing device.

Referring now to FIG. 3, in order to gain additional clarity there is shown an enlarged view of the pin probe assembly (5) and probe mounting block (15). Also depicted is a detailed view of the screw (45) that mounts the probe block assembly to the servo system of the probing apparatus.

Figure 4:
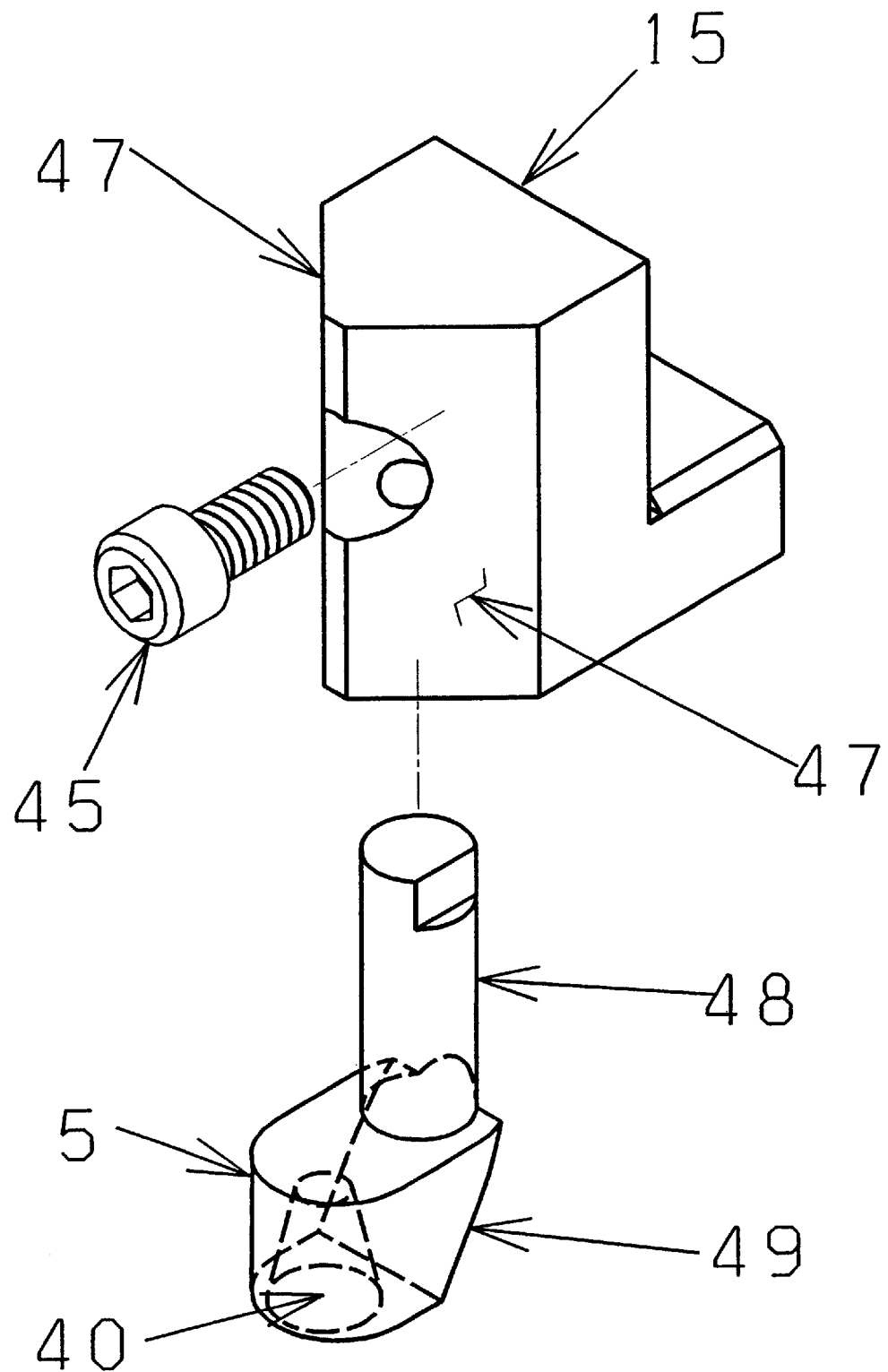
FIG. 4 is an exploded view of a second embodiment of a probe according to the invention, showing the mounting block and retaining screw for mounting the probe to the manufacturing or testing device.

In FIG. 4, there is shown an enlarged view of a second embodiment of the probe (5) and mounting block (15), according to the present invention. Note that section (5) of the probe pin is oval at its bottom. This oval shape was introduced for collision avoidance purposes and with due consideration to restrictions imposed by the probing tool itself. Having an oval section at the bottom allows the conical recessed area to be located further away from the block (15), permitting the two probe arms making measurements to come in much closer proximity to the probe's adjacent pins (numeral 50 in FIG. 2). Pin probe (5) is pressed into block (15) such that the oval section remains at an angle to provide as much clearance as possible by approaching the pins (50, FIG. 2) from an angle different to that of the probe arm (10, FIG. 2) approaching the array of pins (50, FIG. 2).

Referring now to the previously mentioned collision avoidance problem, and with particular reference to the flat sides (47) of the probe block (15) shown in FIGS. 3 and 4, probe block (15) establishes a connection to the pin probe attached to the servo mechanism. The design of the probe block (15) is constrained by the physical characteristics of the servo system and by the Z axis mounted on the XY servo (10). The dimension of the probe block (15) is also regulated by the limitations and characteristics of the collision avoidance software controlling the equipment providing motion to the probe block. Some probe tools are supported by software that allows the probes to gain closer proximity to one other. In such an instance, there are requirements for the shape and size of the probe block that holds the particular tip used for probing. By way of example, a probe block with two flat sides (47, FIGS. 3 and 4) allows the probes to come even closer when positioned side by side. The tool hardware is such that the point of contact to the device under test (DUT) is ahead (in front) of the probe block (15). Having these flat sides makes it possible to have the probe blocks positioned in close proximity to each other without having the two probe blocks contact the other.

Non-conductive Probe Block for Shorts Between Pin Probes During Close Probing

If applicable, the probe block (15) is made of non-conductive material, in which case adequate measures must be implemented to electrically connect the pin probe (5) to the wiring harness (20), and from there, back to the measurement devices used for testing. This precludes probe blocks (15) from shorting the probe pins (5) during close proximity probing. Usually, this condition does not happen in automated probing tools in view of collision avoidance software and the physical characteristics of the probe block (15) design. If, however, this condition occurs, a problem will exist with the automated tooling or the design of the probe block (15) in that it does not adhere to the requirements of the automated probing equipment (100, FIG. 1).

Figure 5:
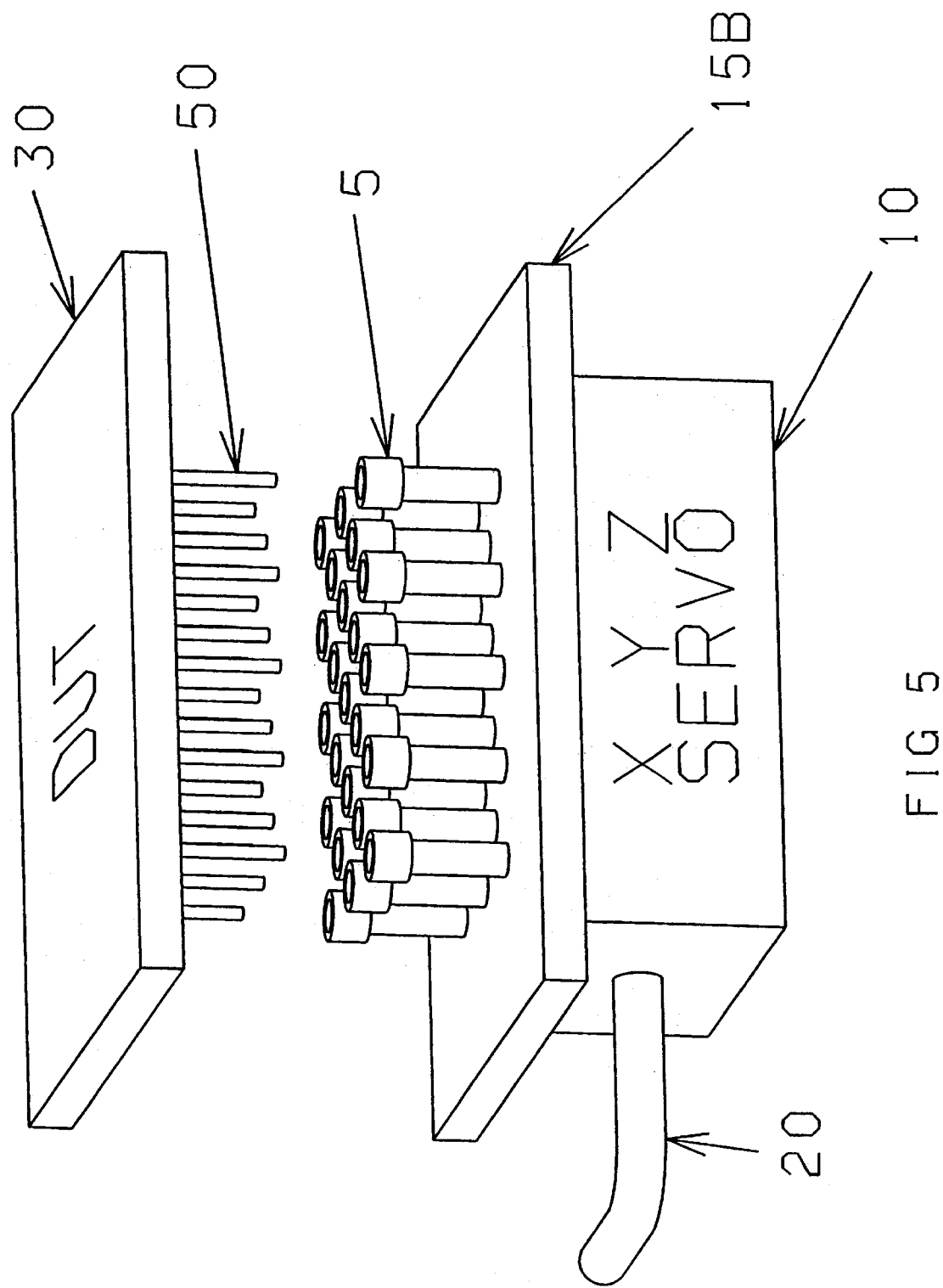

FIG. 5 shows the pin probe (5) mounted as a component of an array of probes or gang probe style. Board (15B) holds the pin probes (5) and is mounted on the servo mechanism (10) or on a manual probe station commonly used for mass production. Cable (20) symbolizes the returning electrical wires by way of the measurement harness connected to the measurement apparatus. The device under test is shown by numeral (30). The DUT is, typically, a circuit board, a substrate, or any device with pins attached to it (e.g., 50). The pins are needed for establishing contact and for taking the necessary electrical measurements to ensure the quality of the DUT (30).

Gang Probing on a Servo System with an Array of Pin Probes and Probe Block

In FIG. 5, the gang probe or array of pin probes (5) is mounted on probe block (15B) that replaces the probe block (15) shown in the previous figures. This design is provided with a plurality of pin probes (5) mounted on a servo mechanism (10). The array of pin probes (5) tests the pin array (50) that is grouped in the same pattern on the DUT (30). For simplicity sake, only a single arrangement of pins under test (50) from the plurality of groups is shown. Two gang probes (of which only one illustrated) do the testing alternating from one group of pins under test to another group. With this type of probing setup, the probe block (15B) can be constructed much sturdier because close proximity probing is not relevant since the groups of pins under test (50) are spaced between other groups separating them. Individual electrical connections are needed from the probe pins (5) to the wiring harness (20) connecting the probe pins to the measurement apparatus (not shown). This is achieved in a variety of ways, including wires, coaxial cables, and the like.

Figure 6:
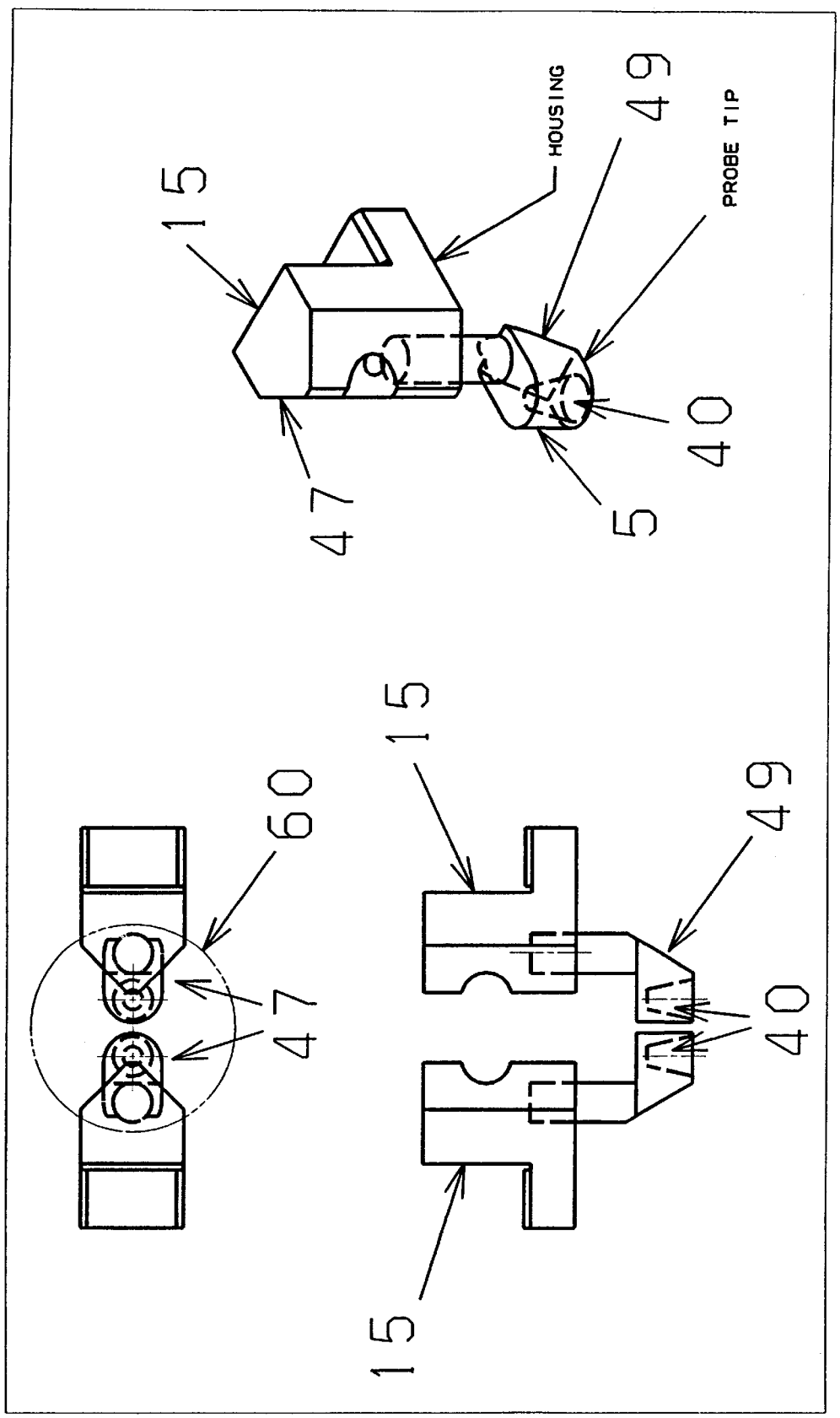
FIG. 6 is a schematic diagram of a pin probe used for collision avoidance and which is provided with a pin probe having an oval shaped bottom and a conical recessed area.

Two versions of pin probes suitable for collision avoidance problems are illustrated in FIGS. 4 and 6. Both are provided with a pin probe (5) having an oval bottom. The conical recessed area is located toward the end of the oval opposite the cylindrical post end. This end is keyed (48) to the probe block (15) to eliminate any rotation within the probe block (15). The advantage of utilizing the oval shape is that the conical recessed area (40) is located out ahead of the probe block (15), thus allowing the conical recessed area of both probes to come in closer proximity without making a contact with one another, as shown in FIG. 6 by numeral (60). The oval shape makes the pin probe appear larger. Due consideration must be given to dimensions since spacing between the pins under test may be at a minimum in instances when the pins are packed tightly together. A slightly different version of this design is obtained by cutting away the back area and by leaving additional clearance (see FIG. 4 showing the cut away section). This cut away section (49) endows the pin probe (5) with a conical recessed area (40) located ahead of the probe block (15) that fits between the pins under test (50) when the interstitial distance is small. This design meets the requirements of most collision avoidance software on most conventional automated probing equipment. Again, the dimensions of the probe assembly vary with each application depending on the DUT and automated equipment tooling.

A description of the apparatus attaching the probe block (15) to the servo will now be discussed. The physical shape of probe block (15) varies with the requirements and characteristics of the automated probing equipment. In addition, the portion which is attached to the Z axis of servo (10) also varies with the design. As shown in FIGS. 3 and 4, the probe block is anchored to the servo (10) by a Allen key screw (45) or by any other similar fastening means, e.g., clamping mechanism, that attaches the probe block to the servo mechanism. The attachment of the probe block (15) to the servo varies with the application and the tooling of the equipment.

While the invention has been described in terms of several embodiments, those skilled in the art will recognize that the invention can be practiced with changes and modifications, all of which remain within the scope and the spirit of the appended claims.

Having thus described the invention what is claimed as new and desired to be secured by Letters Patent is as follows:

1. A probe assembly comprising:
   detachable contractors, each of which makes electrical contact to a pin of a device, board or package under test, each of said contactors comprising a shaft terminating in an end section provided with a recessed area for receiving a pin of said device, board or package under test; and
   servo mechanisms providing multi-directional motion to said detachable contactors, each of said servo mechanisms being respectively provided with an offset section attached to the shaft of one of said detachable contactors, allowing said servo mechanisms to come in close proximity of one another without making contact or colliding with one another.

2. The probe assembly as recited in claim 1, wherein said recessed area has a shape that is selected from the group that consists of a hemispheric, conical, cylindrical and hyperboloid shape.

3. The probe assembly as recited in claim 1 wherein said detachable contactors probe said pins of said device, board or package under test for open circuits and shorts.

4. The probe assembly as recited in claim 1, wherein said servo mechanism is an actuator.

5. The probe assembly as recited in claim 1, wherein said offset extends beyond a block integral to said servo mechanism, said block being provided with a wedged end section to minimize a chance of two servo mechanisms testing said pins colliding with one another.

6. The probe assembly as recited in claim 1 wherein said detachable contactors have the recess area at an end section of said shaft in a direction away from the offset section of said servo mechanism.

7. The probe assembly as recited in claim 6, wherein said conical shaped recess is positioned at an end that is offset from said shaft.

8. The probe assembly as recited in claim 1 wherein said servo mechanisms respectively provide an x, y and z motion to said attachable contactors.

9. The probe assembly as recited in claim 1 wherein said servo mechanisms are activated by software.

10. The probe assembly as recited in claim 1 wherein said detachable contactor is electrically coupled to a wiring harness, said wiring harness being further coupled to a measuring device for testing for shorts and open circuit conditions between said pins.

11. The probe assembly as recited in claim 1 wherein the offset section of said servo mechanism is made of non-conductive material.

* * * * *